United States Patent
Colvin et al.

(10) Patent No.: US 10,170,286 B2
(45) Date of Patent: Jan. 1, 2019

(54) IN-SITU CLEANING USING HYDROGEN PEROXIDE AS CO-GAS TO PRIMARY DOPANT OR PURGE GAS FOR MINIMIZING CARBON DEPOSITS IN AN ION SOURCE

(71) Applicant: Axcelis Technologies, Inc., Beverly, MA (US)

(72) Inventors: Neil K. Colvin, Merrimack, NH (US); Tseh-Jen Hsieh, Rowley, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 15/281,844

(22) Filed: Sep. 30, 2016

(65) Prior Publication Data
US 2018/0096828 A1    Apr. 5, 2018

(51) Int. Cl.
*H01J 37/08* (2006.01)
*H01J 37/32* (2006.01)
(Continued)

(52) U.S. Cl.
CPC ........ *H01J 37/32862* (2013.01); *C23C 14/48* (2013.01); *H01J 37/08* (2013.01);
(Continued)

(58) Field of Classification Search
CPC ............ H01J 37/32862; H01J 37/3171; H01J 2237/006; H01J 2237/18; H01J 2237/08; H01J 2237/31705; C23C 14/48
(Continued)

(56) References Cited

U.S. PATENT DOCUMENTS

| 6,135,128 A | 10/2000 | Graf et al. |
| 6,242,165 B1 * | 6/2001 | Vaartstra ................... G03F 7/42 |
| | | 134/1 |

(Continued)

FOREIGN PATENT DOCUMENTS

| WO | 2010/093380 A1 | 8/2010 |
| WO | 2013/122986 A8 | 8/2013 |

OTHER PUBLICATIONS

International Search Report and Written Opinion dated Dec. 20, 2017 for International Application No. PCT/US2017/053701.

*Primary Examiner* — Michael Maskell
(74) *Attorney, Agent, or Firm* — Eschweiler & Potashnik, LLC

(57) ABSTRACT

An ion source assembly and method is provided for improving ion implantation performance. The ion source assembly has an ion source chamber and a source gas supply provides a molecular carbon source gas such as toluene to the ion source chamber. A source gas flow controller controls a flow of the molecular carbon source gas to the ion source chamber. An excitation source excites the molecular carbon source gas, forming carbon ions and atomic carbon. An extraction electrode extracts the carbon ions from the ion source chamber, forming an ion beam. A hydrogen peroxide co-gas supply provides a predetermined concentration of hydrogen peroxide co-gas to the ion source chamber, and a hydrogen peroxide co-gas flow controller controls a flow of the hydrogen peroxide gas to the ion source chamber. The hydrogen peroxide co-gas decomposes within the ion source chamber and reacts with the atomic carbon from the molecular carbon source gas in the ion source chamber, forming hydrocarbons within the ion source chamber. An inert gas is further introduced and ionized to counteract oxidation of a cathode due to the decomposition of the hydrogen peroxide. A vacuum pump system removes the hydrocarbons from the
(Continued)

ion source chamber, wherein deposition of atomic carbon within the ion source chamber is reduced and a lifetime of the ion source chamber is increased.

12 Claims, 8 Drawing Sheets

(51) Int. Cl.
*C23C 14/48* (2006.01)
*H01J 37/317* (2006.01)

(52) U.S. Cl.
CPC ..... *H01J 37/3171* (2013.01); *H01J 2237/006* (2013.01); *H01J 2237/022* (2013.01); *H01J 2237/08* (2013.01); *H01J 2237/18* (2013.01); *H01J 2237/31705* (2013.01)

(58) Field of Classification Search
USPC .............. 250/492.1, 423 R, 424; 313/362.1; 315/111.01, 111.21, 111.31, 111.81
See application file for complete search history.

(56) References Cited

U.S. PATENT DOCUMENTS

| | | | |
|---|---|---|---|
| 6,734,120 B1* | 5/2004 | Berry | G03F 7/427 |
| | | | 257/E21.252 |
| 8,779,395 B2* | 7/2014 | Colvin | H01J 27/022 |
| | | | 118/723 R |
| 2012/0118232 A1* | 5/2012 | Colvin | H01J 27/022 |
| | | | 118/723 R |
| 2012/0119113 A1 | 5/2012 | Colvin et al. | |
| 2016/0020102 A1* | 1/2016 | Byl | H01J 37/08 |
| | | | 438/22 |

* cited by examiner

IN-SITU CLEANING USING HYDROGEN PEROXIDE AS CO-GAS TO PRIMARY DOPANT OR PURGE GAS FOR MINIMIZING CARBON DEPOSITS IN AN ION SOURCE

TECHNICAL FIELD

The present disclosure relates generally to semiconductor device fabrication and ion implantation, and more particularly to a method of improving performance and extending the lifetime of an ion source in an ion implanter.

BACKGROUND

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules are ionized, accelerated, formed into a beam, analyzed, and swept across a wafer, or the wafer is swept through the beam. The dopant ions physically bombard the wafer, enter the surface and come to rest below the surface, at a depth related to their energy.

Referring to FIG. 1, the system 100 includes an ion source 102 for producing an ion beam 104 along a beam path 106. A beamline assembly 110 is provided downstream of the ion source 102 to receive a beam therefrom. The beamline system 110 may include (not shown) a mass analyzer, an acceleration structure, which may include, for example, one or more gaps, and an angular energy filter. The beamline assembly 110 is situated along the path to receive the beam. The mass analyzer includes a field generating component, such as a magnet, and operates to provide a field across the beam path 106 so as to deflect ions from the ion beam 104 at varying trajectories according to mass (e.g., charge to mass ratio). Ions traveling through the magnetic field experience a force which directs individual ions of a desired mass along the beam path 106 and which deflects ions of undesired mass away from the beam path.

A process chamber 112 is provided in the system 100, which contains a target location that receives the ion beam 104 from the beam line assembly 110 and supports one or more workpieces 114 such as semiconductor wafers along the beam path 106 for implantation using the final mass analyzed ion beam. The process chamber 112 then receives the ion beam 104 which is directed toward a workpiece 114. It is appreciated that different types of process chambers 112 may be employed in the system 100. For example, a "batch" type process chamber 112 can simultaneously support multiple workpieces 114 on a rotating support structure, wherein the workpieces 114 are rotated through the path of the ion beam 104 until all the workpieces 114 are completely implanted. A "serial" type process chamber 112, on the other hand, supports a single workpiece 114 along the beam path 106 for implantation, wherein multiple workpieces 114 are implanted one at a time in serial fashion, with each workpiece being completely implanted before implantation of the next workpiece begins. The process chamber 112 may also include a scanning apparatus (not shown) for moving the ion beam 104 with respect to the workpiece 114, or the workpiece with respect to the ion beam.

Ion sources in ion implanters typically generate the ion beam 104 by ionizing within the source chamber 102 a source gas, a component of which can be a desired dopant element, and extracting the ionized source gas in the form of the ion beam. The ionization process is effected by an exciter which may take the form of a thermally heated filament, a filament heating a cathode (indirectly heated cathode "IHC"), or a radio frequency (RF) antenna.

Examples of desired dopant elements of which the source gas is comprised can include carbon, oxygen, boron, germanium, silicon, amongst others. Of increasing interest is the use of carbon, which can be utilized in many implant steps, such as material modification. The most common precursor source gases for carbon implants include carbon dioxide and carbon monoxide.

In constructing the ion source chamber 102 illustrated in FIG. 1, refractory metals such as tungsten and molybdenum are commonly used to form the cathode electrodes and interior wall surfaces of the chamber 102. During generation of the carbon ion utilizing a carbon-containing material, carbon atoms are generated in the ion chamber, and react with the material from which the electrodes, the chamber liners, chamber body and arc slit are constructed. Elemental carbon has a tendency to build up on these surfaces and detrimentally affect the efficiency of the ion source and poison the chamber 102.

SUMMARY

The present disclosure overcomes the limitations of the prior art by providing a system, apparatus, and method for improving performance and extending the lifetime of an ion source in an ion implantation system for carbon implants. Accordingly, the following presents a simplified summary of the disclosure in order to provide a basic understanding of some aspects of the disclosure. This summary is not an extensive overview of the disclosure. It is intended to be neither identify key or critical elements of the invention nor delineate the scope of the invention. Its purpose is to present some concepts of the disclosure in a simplified form as a prelude to the more detailed description that is presented later.

Aspects of the disclosure facilitate ion implantation processes by removing carbon atoms generated from the disassociation and ionization of molecular carbon source gases which can accumulate on structures associated with the ion source, thereby reducing electron emission from the cathode. Beam current, as well as the lifetime of the ion source are thereby increased. Associated apparatus and an ion implantation system for carrying out the method are disclosed herein.

In accordance with one exemplary aspect, an ion source assembly is provided for improving ion implantation performance. The ion source assembly comprises an ion source chamber and a source gas supply configured to provide a molecular carbon source gas to the ion source chamber. The molecular carbon source gas, for example, comprises toluene or another hydrocarbon source material. A source gas flow controller is provided and configured to control a flow of the molecular carbon source gas to the ion source chamber.

An excitation source, for example, is configured to excite the molecular carbon source gas, therein forming carbon ions and atomic carbon. An extraction electrode is further configured to extract the carbon ions from the ion source chamber, therein forming an ion beam.

In accordance with the disclosure, a hydrogen peroxide co-gas supply is provided and configured to provide a predetermined concentration of hydrogen peroxide gas to the ion source chamber. A hydrogen peroxide co-gas flow controller, for example, is configured to control a flow of the hydrogen peroxide gas to the ion source chamber, wherein the hydrogen peroxide gas is configured to decompose within the ion source chamber via the excitation source, therein forming free hydrogen and oxide radicals. The free hydrogen and oxide radicals further react with atomic carbon from the molecular carbon source gas in the ion source chamber, therein forming secondary hydrocarbons within the ion source chamber, as well as one or more of carbon dioxide, carbon monoxide, and water. A vacuum pump system is further provided and configured to remove the hydrocarbons from the ion source chamber, wherein deposition of atomic carbon within the ion source chamber is reduced and a lifetime of the ion source chamber is increased.

The molecular carbon source gas and the hydrogen peroxide co-gas are introduced simultaneously or sequentially into the ion source chamber. Alternatively, the molecular carbon source gas and the hydrogen peroxide co-gas are pre-mixed prior to introduction into the ion source chamber. For example, the hydrogen peroxide co-gas can be utilized as a co-gas with the molecular carbon source gas concurrent with implantation, as a purge gas during times of non-implantation, or both. For example, carbon residuals are reacted with oxygen from peroxide forming carbon monoxide or carbon dioxide gases which are pumped away. Thus, carbon layer build-up is minimized in the ion source chamber. An inert gas such as argon, for example, further stabilizes the arc plasma without significantly contributing the chemical reaction.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
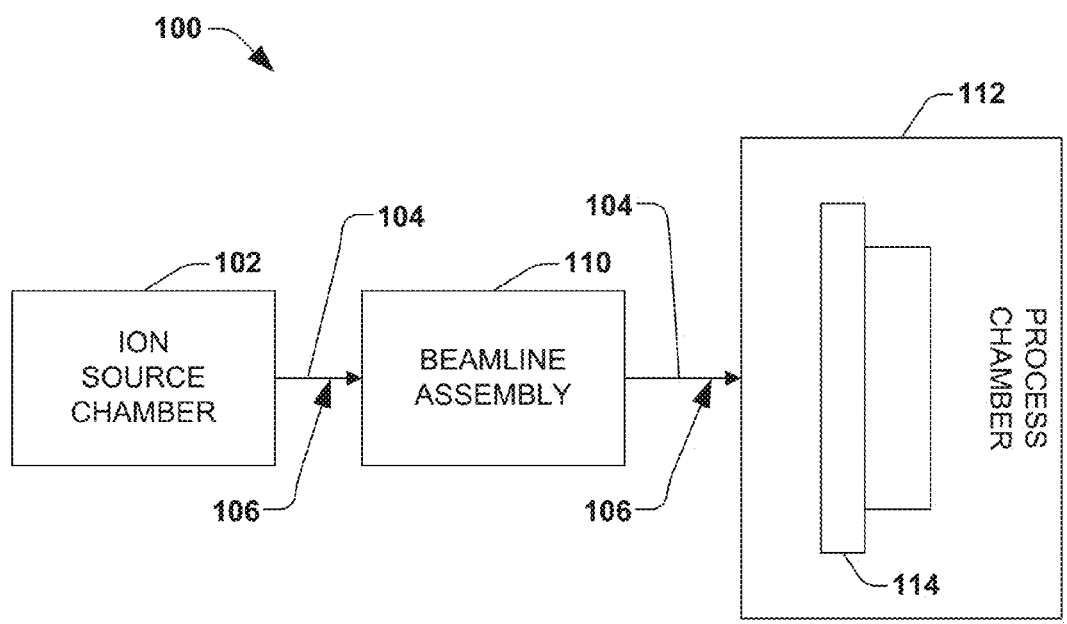
FIG. 1 is an ion implantation system suitable for implementing one or more aspects of the present disclosure in block diagram form.

The present disclosure is directed generally toward a system, apparatus, and method for minimizing carbon deposits in an ion source of an ion implantation system. Accordingly, the present disclosure will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present disclosure. It will be evident to one skilled in the art, however, that the present disclosure may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessary to scale with each other, and the placement of various elements in the drawings is chosen to provide a clear understanding of the respective embodiment and is not to be construed as necessarily being a representation of the actual relative locations of the various components in implementations according to an embodiment of the disclosure. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Recently, significant interest has been seen in using carbon as a pre-amorphizing species in ion implantation systems. Because of its low mass, it is typically difficult to amorphize with monomer carbon at conventional workpiece temperatures, unless doses far exceed $1\times10^{15}$ $cm^{-2}$. However, when implanting via a spot ion beam implanter, such as the Optima HDx or Purion H implanters manufactured by Axcelis Technologies of Beverley, Mass., the amorphization threshold for carbon in silicon wafers can be reduced to as low as $5\times10^{14}$ $cm^{-2}$ if the wafer is cooled during implantation, and the density of the carbon beam is sufficiently high.

The amorphization of the silicon wafer can be performed using monomer carbon (C) implants at wafer temperatures in the range of −30° C. to −50° C. One drawback of cold implants using monomer carbon, however, is that the quantity of wafers implanted per unit of time, commonly known as wafers per hour (WPH), is reduced.

Further, reducing the temperature of the workpiece during ion implantation has the effect of minimizing the "self-annealing" component of the implant on the crystalline lattice, wherein a relaxation of damage occurs in a very short period of time after the ions penetrate into the lattice structure of the wafer. The diffusion process is also sensitive to substrate temperature. Reducing or eliminating self-annealing results in a larger net displacement of atoms and altered damage profile, thus leading to the formation of a thicker amorphous layer and reduced end-of-range (EOR) damage that can be responsible for device leakage.

An alternate approach is to use molecular carbon at an equivalent higher energy in order to achieve the similar effect of monomer carbon (C) amorphization of the silicon crystals, but at the ambient temperature. The material damaging physics are similar after solid phase epitaxial regrowth at elevated temperatures, and end-of-range dislocation loops can be diminished and repaired. Other improvements such as improved solid phase epitaxial regrowth during anneal, a sharper amorphous/crystalline boundary, and reduced dopant movement from transient enhanced diffusion (TED) can also be attained.

The use of molecular carbons, such as toluene ($C_7H_8$) for damage engineering in semiconductor processing avoids the added expense and complexity of having to cool the substrate to sub-zero temperatures while implanting large molecules, such as $C_7$. Due to the size of the toluene molecule, the impact at predetermined energies will amorphize the crystalline structure of the semiconductor workpiece, thus resulting in a thicker damaged layer and improved device performance.

Figure 2A:
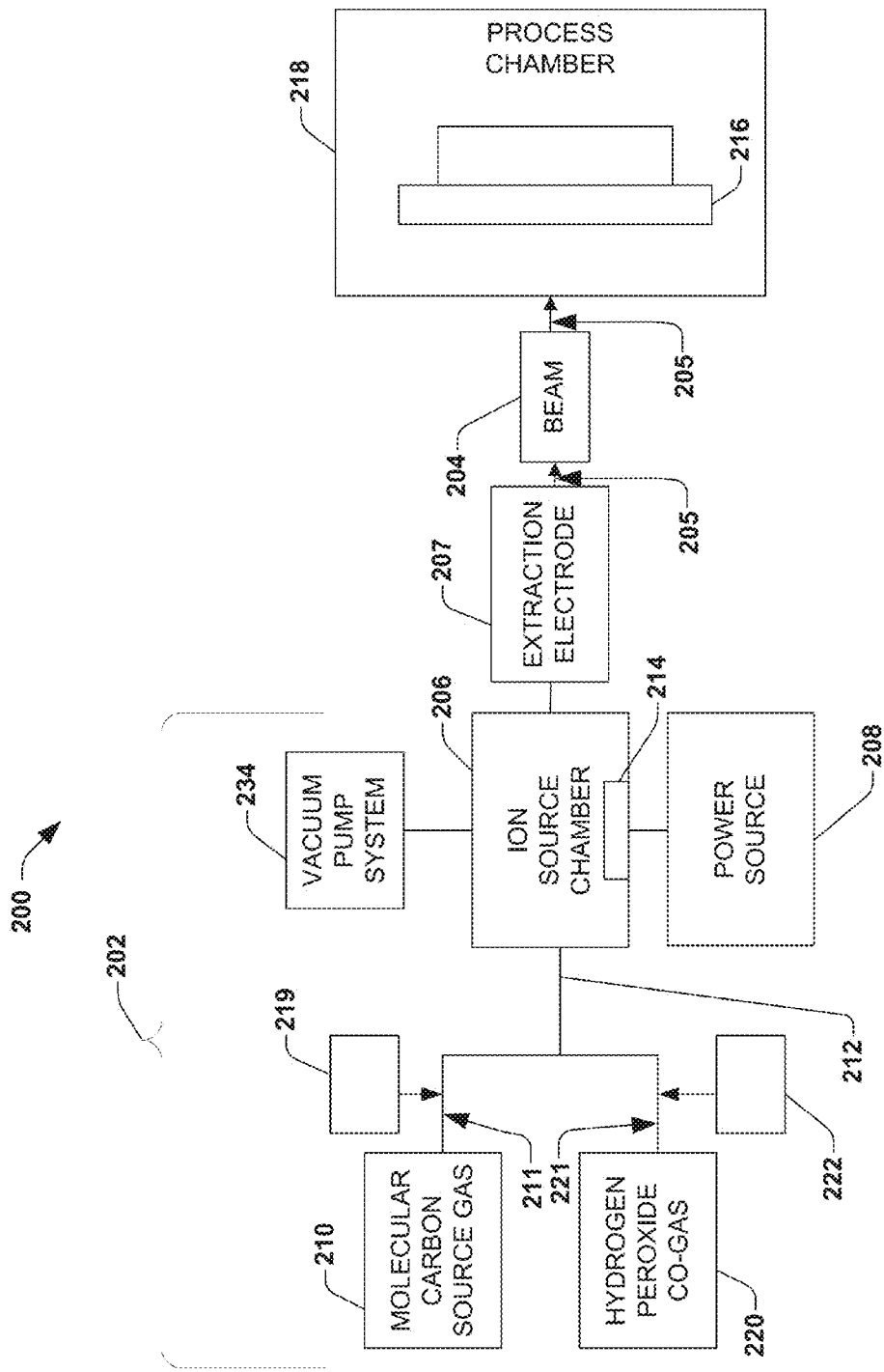
FIG. 2A is an ion implantation system illustrating one embodiment of an ion source assembly in accordance with an aspect of the disclosure.

Referring initially to FIG. 2A, an exemplary ion implantation system 200 is provided in block diagram form, wherein the ion implantation system is suitable for implementing one or more aspects of the disclosure. The system 200 includes an ion source assembly 202 for producing an ion beam 204 along a beam path 205. The ion beam assembly 202 includes, for example, an ion source chamber 206 with an associated power source 208. The ion source chamber 206, for example, may comprise a relatively long plasma confinement chamber from which the ion beam 204 is extracted and accelerated. An extraction electrode 207 is positioned for extraction of an ion beam from the ion source chamber 206.

A source gas supply 210 containing a molecular carbon source gas 211 is coupled to the ion source chamber 206 via a common inlet 212. An exciter 214 associated with the ion source chamber 206, for example, is configured to energize the molecular carbon source gas 211, therein forming a plasma. The exciter 214, for example, may comprise a thermally heated filament, a filament heating a cathode (indirectly heated cathode "IHC"), or a radio frequency (RF) antenna operably coupled to the power source 208. The ion beam 204 is then extracted through the extraction electrode 207 and directed toward a workpiece 216 (e.g., a semiconductor wafer, such as silicon) positioned within a process chamber 218, wherein the ions are implanted into the workpiece.

The molecular carbon source gas 211, for example, can comprise a hydrocarbon such as toluene ($C_7H_8$) or another hydrocarbon ($C_xH_x$). Toluene, for example, is a weakly bonded molecule which typically needs minimal energy to crack the bonds therein. As such, the power source 208 is typically run at a very low arc voltage, thus translating into a low acceleration potential for ions to travel to electrical ground. Conventionally, over time, toluene will poison or alter the work function of the exciter 214 (e.g., a surface of the cathode), thus reducing the electron emission and associated production of desired ions. Prior attempts to overcome the poisoning of the exciter 214 surface, such as using a large cathode power supply, have failed when the voltage required to maintain electron emission exceed the rating of the power supply 208. Thus, when the power supply 208 reaches its maximum, the power supply will run in an open loop and not properly self-servo. Another alternative is to utilize a reduced mass cathode tip for the exciter 214, along with a refractory metal such as tantalum that has a lower work function. The addition of argon or similar inert gases is required to eliminate cathode oxidation due to the introduction of hydrogen peroxide. Without the ionized inert gas to sputter clean the cathode surface electron emission will be reduced with a subsequent reduction in ion beam current. For example, carbon residuals are reacted with oxygen from peroxide forming carbon monoxide or carbon dioxide gases and are pumped away. Thus, carbon layer build-up is minimized in the ion source chamber. An inert gas, for example, is further introduced and ionized to counteract oxidation of a cathode due to the decomposition of the hydrogen peroxide. An inert gas such as argon, for example, further stabilizes the arc plasma without contributing the chemical reaction, such as:

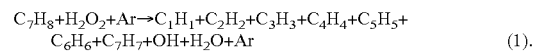

$$C_7H_8+H_2O_2+Ar \rightarrow C_1H_1+C_2H_2+C_3H_3+C_4H_4+C_5H_5+ \\ C_6H_6+C_7H_7+OH+H_2O+Ar \qquad (1).$$

The carbon in the molecular carbon source gas 211 such as toluene typically needs a higher than normal flow rate (e.g., greater than approximately 10 sccm) with a corresponding pressure of approximately 36.7 Torr at 30° C. in order to generate enough vapor to support reliable operation. Such higher flows of molecular carbon result in increased deposition of atomic carbon inside the ion source chamber 206 and on the extraction electrode 207 and associated optics. As such, the residual atomic carbon will build up on the interior surfaces of the ion source chamber 206, and is typically highly stressed, whereby the residual atomic carbon will generally peel or flake off from the surfaces when the ion source chamber 206 is cooled. As such, excessive arcing and shortened life of the ion source chamber 206 has been experienced using conventional systems and methods.

Thus, in accordance with the present disclosure, a source gas flow regulator 219 controls the amount and rate of molecular carbon source gas 211 to the ion source chamber 206. Further, a hydrogen peroxide co-gas supply 220 containing a hydrogen peroxide co-gas 221 is further coupled to ion source chamber 206 via the common inlet 212. A co-gas flow regulator 222 controls the amount and rate of hydrogen peroxide co-gas 221 to be supplied to ion source chamber 206. The hydrogen peroxide co-gas 221, for example, comprises 50% or more free agent.

Figure 2B:
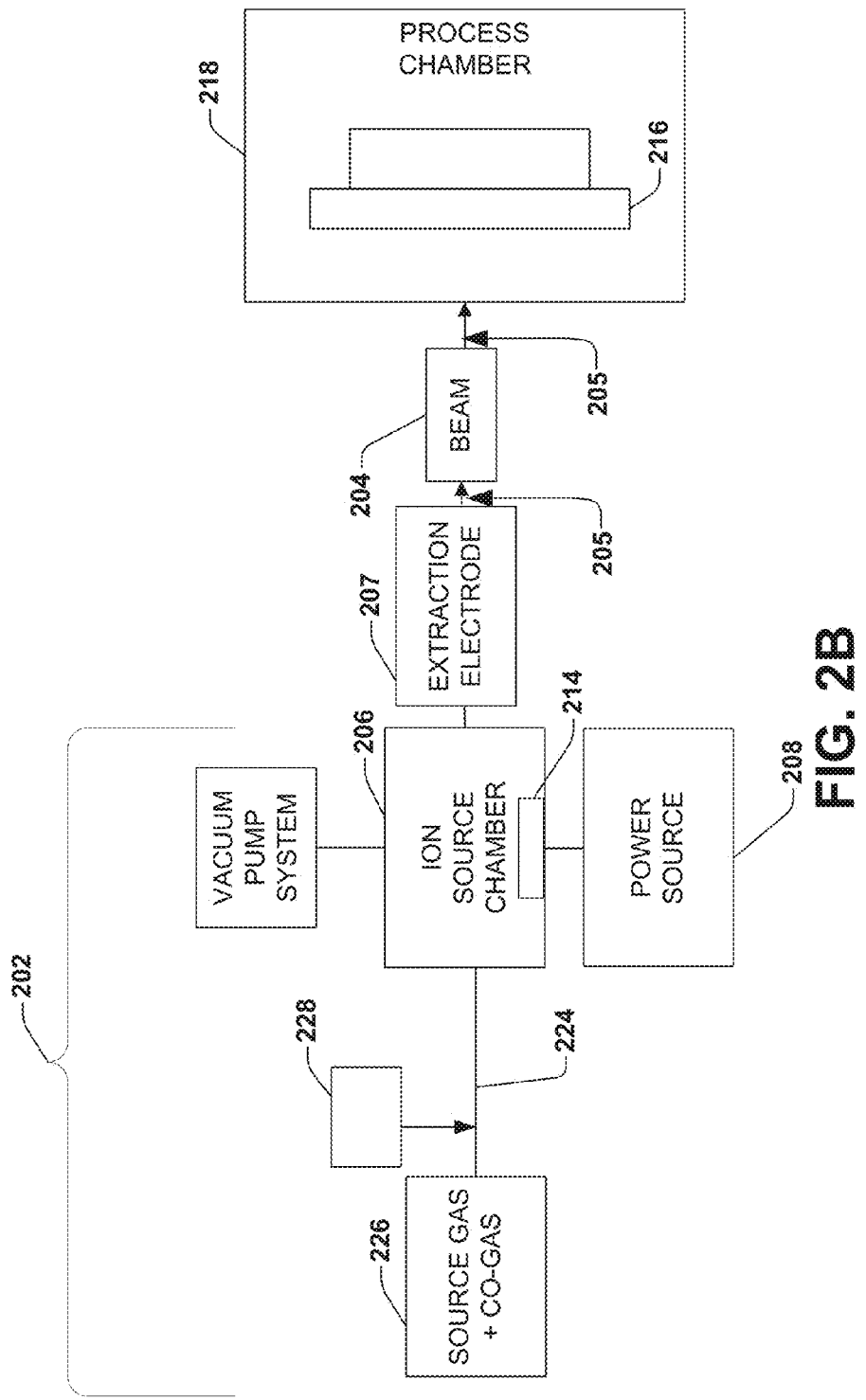
FIG. 2B is an ion implantation system illustrating an alternative embodiment of an ion source assembly in accordance with an aspect of the disclosure.
Figure 2C:
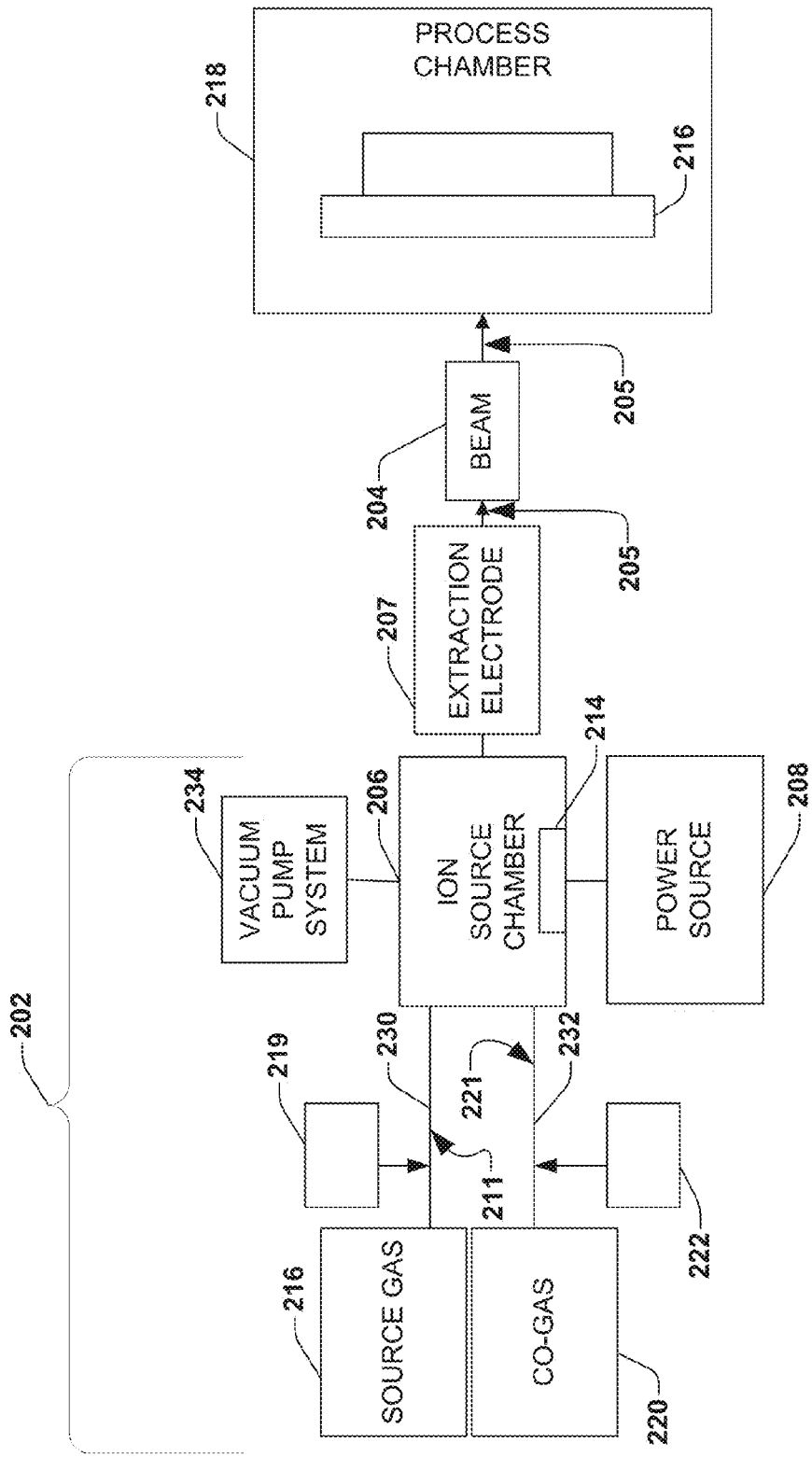
FIG. 2C is an ion implantation system illustrating a further embodiment of an ion source assembly in accordance with an aspect of the disclosure.

FIGS. 2B-2C illustrate alternative embodiments of the disclosure. Where the source gas 211 and hydrogen peroxide co-gas 221 are obtained from separate supplies and mixed in inlet 212 prior to entry into the ion source chamber 206 in the previous embodiment, it is also contemplated that the molecular carbon source gas 211 and hydrogen peroxide co-gas 221 may be obtained as a pre-mixed product and supplied to the ion source chamber 206 in one product, as illustrated in FIG. 2B. As such, a mixture 226 of source gas and co-gas are supplied in a single source with an associated gas flow meter 228 which controls the rate and flow of mixture 226 into the ion source chamber 206. Single source 226 enters ion source chamber 206 through inlet 212.

During operation of the ion source chamber 206, the molecular carbon source gas and hydrogen peroxide co-gas mixture 226 are released into the ion source chamber 206 through inlet 212. The molecular carbon source gas and hydrogen peroxide gas are dissociated and/or ionized to form a plasma of charged particles containing carbon ions, hydrogen ions and oxygen ions. Free oxygen ions react with hydrogen ions from both gases to form water molecules and hydroxide which are removed from the chamber 206 by vacuum pump system 234.

FIG. 2C illustrates a further embodiment in which two separate inlets 230, 232 are provided, one for molecular carbon source gas 211 and one for the hydrogen peroxide co-gas 221. The gases 211, 221 are then mixed in the ion source chamber 206. Gas flow meter 218 for source gas 210 and gas flow meter 212 for co-gas 220 control flow of the gases through inlets 230 and 232, respectively, for entry into ion source chamber 206. During operation of the ion source chamber 206, the molecular carbon source gas 211 and hydrogen peroxide co-gas 221 are introduced into ion source chamber 206 through inlet 212. Molecular carbon source gas 211 is dissociated and/or ionized to form a plasma of charged particles containing carbon ions and oxygen ions. Free oxygen ions react with hydrogen peroxide co-gas 221 to form carbon monoxide (CO), carbon dioxide ($CO_2$) and water molecules and hydroxides which are removed from the chamber 206 by a vacuum pump system 234.

Figure 3:
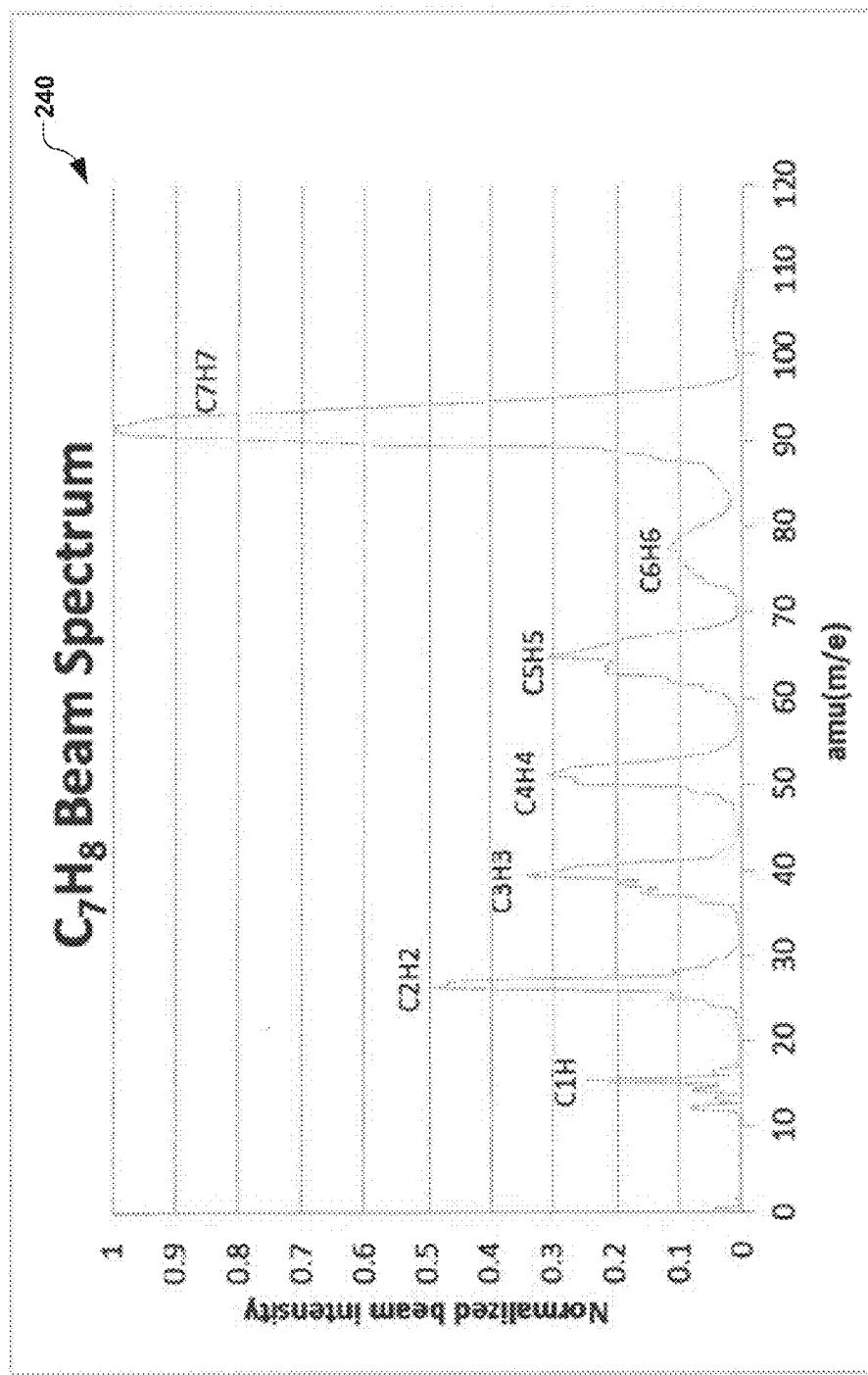
FIG. 3 is a graphical representation illustrating a mass spectra of normalized beam intensity of molecular carbon in an ion source chamber in accordance with an aspect of the disclosure.

FIG. 3, for example, illustrates an exemplary beam spectrum 240 utilizing toluene ($C_7H_8$) as the molecular carbon source gas 211, wherein the toluene is the majority peak with a corresponding atomic mass unit (AMU) of 91. The remaining peaks are generally unusable by-products that are generally not utilized in the ion implantation, but contribute to carbon build-up within the ion source chamber 206 of FIGS. 2A-2C. The unusable by-products and remaining carbon monoxide, carbon dioxide, and water are removed via the vacuum pump system 234. For example, the chemical reaction of the molecular carbon source gas 211 and the hydrogen peroxide co-gas 221 can be described as:

$$aH_2O_2 + bC_xH_x \rightarrow cH_xC_x(g) + dH_2O \quad (2)$$

where constants a, b, c, and d are balanced according to the desired molecular carbon source gas chosen for the implantation.

Figure 4:
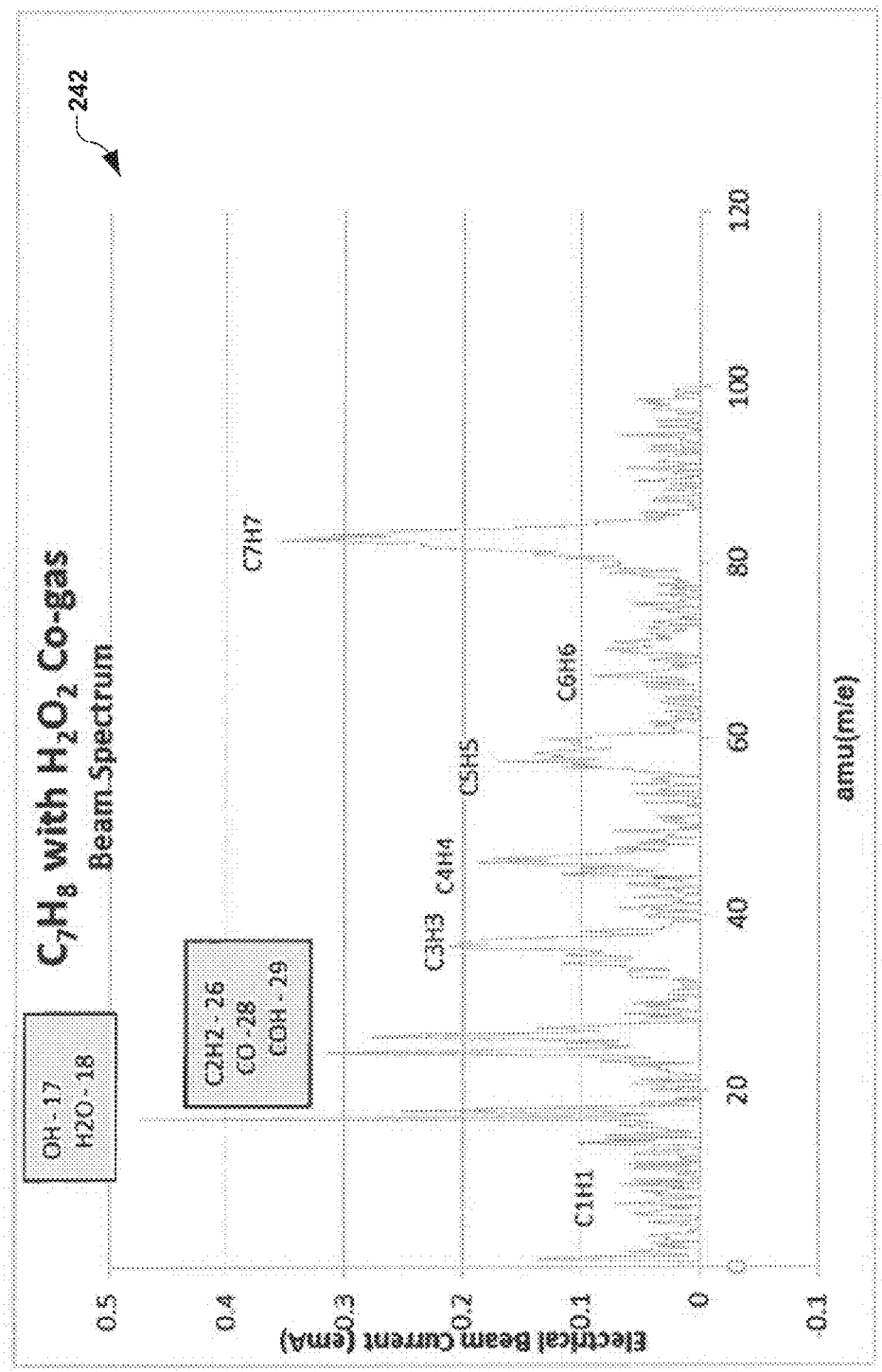
FIG. 4 is a graphical representation illustrating a mass spectra of beam current of toluene with a hydrogen peroxide co-gas in accordance with an aspect of the disclosure.

As illustrated in FIG. 4, a beam spectrum 242 of toluene as the molecular carbon source gas 211 and hydrogen peroxide co-gas 221 is illustrated, wherein peaks of AMU 26, 28, and 29 show unusable carbon ions are reacting with O— and can be removed from the ion source chamber 206 via the vacuum pump system 234 of FIGS. 2A-2C, as opposed to being deposited within the ion source chamber.

Figure 5:
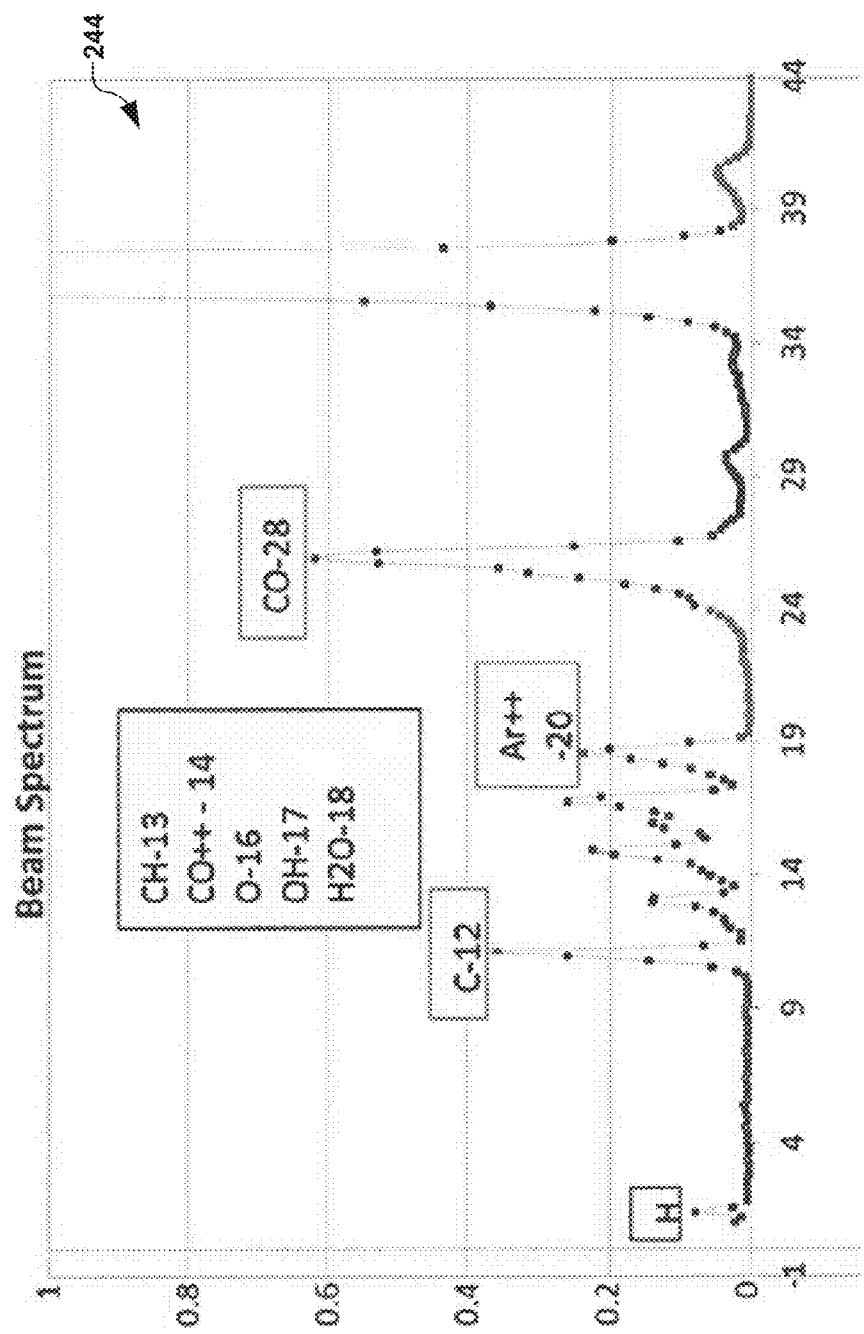
FIG. 5 is a graphical representation illustrating a mass spectra of beam current of toluene with argon and hydrogen peroxide co-gas in accordance with an aspect of the disclosure.
Figure 6:
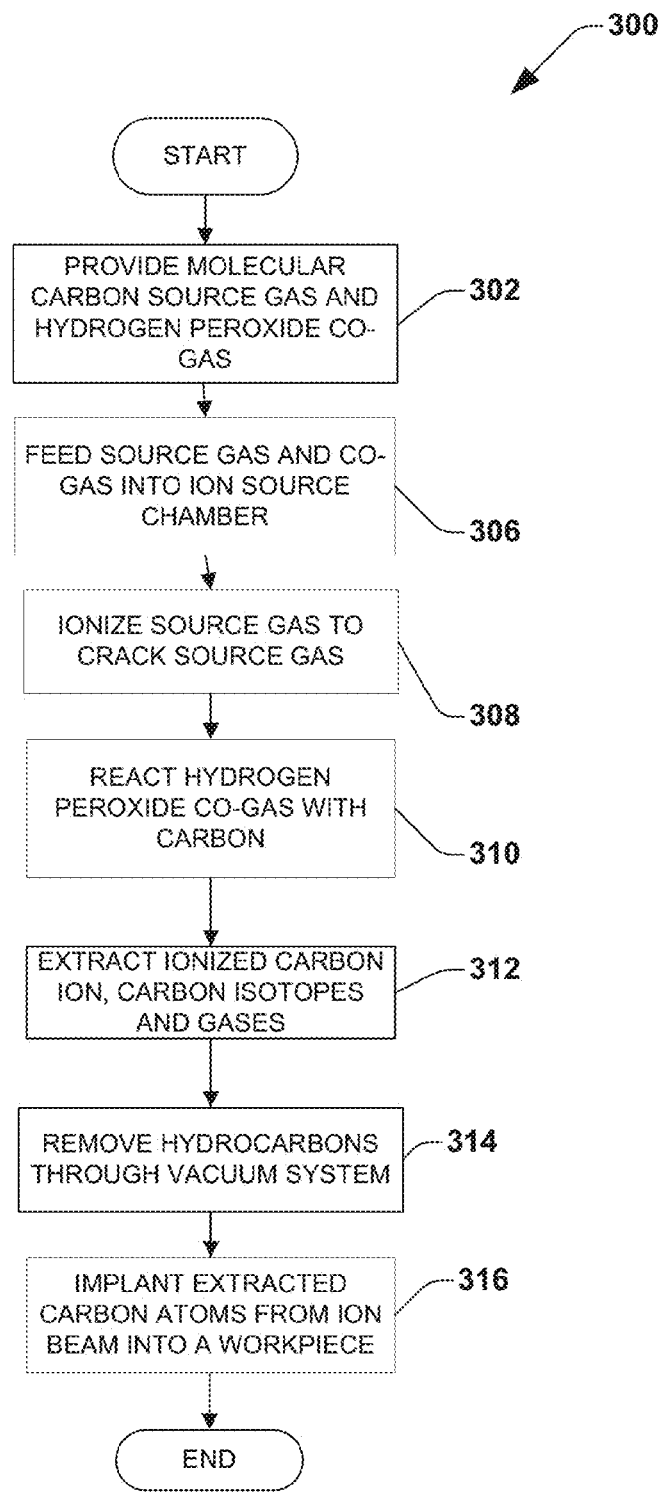
FIG. 6 is a flow diagram illustrating a method of in accordance with an aspect of the disclosure.

FIG. 5 illustrates a beam spectrum 244 showing the effect of a low flow of argon in conjunction with a high flow of hydrogen peroxide into the ion source chamber. The ionization of argon or a similar inert gas helps prevent the oxidation of the cathode surface and subsequent reduction in cathode electron emission (e.g., leading to a reduction in ion beam current). Peaks having AMU 12, 13, 14, and 28 illustrate that carbon deposits within the ion source chamber 206 of FIGS. 2A-2C are removed via the introduction of the hydrogen peroxide co-gas 221 In accordance with another exemplary aspect of the disclosure, FIG. 6 illustrates an exemplary method 300 for improving performance and extending lifetime of an ion source utilizing a molecular carbon source gas in an ion implanter in accordance with an aspect of the disclosure. The method 300 employs a hydrogen peroxide co-gas during operation of the ion implantation system in order to facilitate removal of carbon generated when a molecular carbon source gas is utilized. The above figures and description can also be referenced with this method 300 for further description.

It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

The method 300 begins at block 302 wherein a molecular carbon source gas and a hydrogen peroxide co-gas are supplied. The method continues at 306 where the source gas and co-gas are fed into an ion source chamber where electrons emitted by a cathode are accelerated and ionize the gas molecules of the source gas at 308 within the ion source chamber to crack the source gas and created the desired ion. At 310, the hydrogen peroxide co-gas is reacted with free oxygen ions to form water or hydroxide. Ionized carbon ions, carbon isotopes, and oxygen are extracted at 312. Water and hydroxide molecules are then removed by a vacuum pump system at 314. At 316, the extracted carbon ions are implanted from an ion beam into a workpiece.

The selected flow rates of the molecular carbon source gas and hydrogen peroxide co-gas can vary so that the maximum amount of oxygen ions are removed without deleteriously affecting the beam current. The amount of co-gas supplied can be determined, at least in part, by analysis of the beam composition during operation.

While, for purposes of simplicity of explanation, the method 300 is depicted and described as executing serially, it is to be understood and appreciated that the present disclosure is not limited by the illustrated order, as some aspects could, in accordance with the disclosure, occur in different orders and/or concurrently with other aspects from that depicted and described herein. For instance, it is contemplated that the flow of molecular carbon source gas and hydrogen peroxide co-gas into the ion source chamber may occur simultaneously. In another embodiment, it is contemplated that the flow of these gases may occur sequentially, such that a molecular carbon source gas is introduced into the ion source chamber, followed by a flow of hydrogen-containing co-gas into the ion source chamber. Moreover, not all illustrated features or blocks may be required to implement a methodology in accordance with an aspect the present disclosure.

Although the disclosure has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising." Additionally, the term "exemplary" is intended to indicate an example and not a best or superior aspect or implementation.

The invention claimed is:

1. An ion source assembly for improving ion implantation performance, the ion source assembly comprising:
    an ion source chamber;
    a source gas supply configured to provide a molecular carbon source gas to the ion source chamber;
    a source gas flow controller configured to control a flow of the molecular carbon source gas to the ion source chamber during periods of ion implantation;
    an excitation source configured to excite the molecular carbon source gas, therein forming carbon ions and residual carbon;
    an extraction electrode configured to extract the carbon ions from the ion source chamber, therein forming an ion beam;
    a hydrogen peroxide co-gas supply configured to provide a predetermined concentration of hydrogen peroxide gas to the ion source chamber;
    a hydrogen peroxide co-gas flow controller configured to control a flow of the hydrogen peroxide gas to the ion source chamber as a purge gas during periods of non-implantation, wherein the hydrogen peroxide gas decomposes within the ion source chamber and reacts with the residual carbon from the molecular carbon source gas in the ion source chamber, therein forming hydrocarbons within the ion source chamber; and
    a vacuum pump system configured to remove the hydrocarbons from the ion source chamber, wherein deposition of the residual carbon within the ion source chamber is reduced and a lifetime of the ion source chamber is increased.

2. The ion source assembly of claim 1, wherein the molecular carbon source gas comprises toluene.

3. The ion source assembly of claim 1, wherein the molecular carbon source gas and the hydrogen peroxide gas are introduced simultaneously into the ion source chamber.

4. The ion source assembly of claim 1, further comprising an inert gas supply configured to provide an inert gas to the ion source chamber.

5. The ion source assembly of claim 4, wherein the inert gas comprises argon.

6. The ion source assembly of claim 1, wherein the molecular carbon source gas comprises a gaseous hydrocarbon.

7. The ion source assembly of claim 1, wherein the source gas flow controller and the hydrogen peroxide co-gas flow controller are separate controllers.

8. The ion source assembly of claim 1, wherein the source gas flow controller and the hydrogen peroxide co-gas flow controller are a single controller.

9. The ion source assembly of claim 1, wherein the molecular carbon source gas and the hydrogen peroxide gas are supplied to the ion source chamber through separate inlets.

10. The ion source assembly of claim 1, wherein the molecular carbon source gas and the hydrogen peroxide gas are supplied to the ion source chamber through a common inlet.

11. The system of claim 1, wherein the molecular carbon source gas and the hydrogen peroxide co-gas are introduced sequentially into the ion source chamber.

12. The system of claim 1, wherein the molecular carbon source gas and the hydrogen peroxide co-gas are pre-mixed prior to introduction into the ion source chamber.

* * * * *